United States Patent [19]

Taylor

[11] Patent Number: 4,672,568
[45] Date of Patent: Jun. 9, 1987

[54] METHOD FOR DIGITAL VOLTAGE CONTROLLED OSCILLATOR

[75] Inventor: David M. Taylor, San Jose, Calif.

[73] Assignee: Advanced Micro Devices, Inc., Sunnyvale, Calif.

[21] Appl. No.: 620,993

[22] Filed: Jun. 15, 1984

[51] Int. Cl.$^4$ .............................................. G06F 15/31
[52] U.S. Cl. ........................................ 364/721; 328/14
[58] Field of Search ................... 364/721; 179/84 VF; 328/14; 307/261

[56] References Cited

U.S. PATENT DOCUMENTS

| 4,068,178 | 1/1978 | Tunzi | 328/14 |
| 4,130,876 | 12/1978 | Mitsuhashi | 364/721 |
| 4,159,527 | 6/1979 | Yahata et al. | 364/721 |
| 4,328,554 | 5/1982 | Mantione | 364/721 |
| 4,563,548 | 1/1986 | Misherghi et al. | 179/84 VF |

Primary Examiner—David H. Malzahn
Attorney, Agent, or Firm—Patrick T. King

[57] ABSTRACT

A method for approximating a continuous range of signals having sinusoidal waveforms with signals having trapezoidal waveforms, and for generating a continuous range of frequencies around a given center frequency. The method forms trapezoidal waveforms by a computational technique. A periodic triangular waveform is first formed by repetitiously adding and subtracting an amplitude increment at a succession of time intervals. The time intervals can be large, thereby allowing a low sampling frequency. The peaks of the triangular waveform are truncated to form the trapezoidal waveform. The method can be easily implemented within a standard arithmetic logic unit (ALU) structure.

4 Claims, 4 Drawing Figures

METHOD FOR DIGITAL VOLTAGE CONTROLLED OSCILLATOR

BACKGROUND OF THE INVENTION

This invention relates generally to voltage controlled oscillators (VCOs) and relates more particularly to a method for approximating sinusoidal waveforms with trapezoidal waveforms in a manner which can be implemented within an arithmetic logic unit (ALU) structure.

VCOs are used in many applications, such as frequency synthesis, modulation, demodulation, frequency multiplication and clock synchronization. VCOs are often used as part of a phase lock loop in such applications. As the name implies, a voltage is used to control the frequency of the VCO's output signal.

Many VCOs are analog devices which require circuitry dedicated to the particular function involved and can generate a range of frequencies determined by the characteristics of the resistors, capacitors, transistors and other devices used.

Other VCOs are digital devices which generate square waves or triangular waves. Square waves and triangular waves have harmonic frequencies with significant amplitudes and thus their suitability for many applications is limited.

It is known that a trapezoidal waveform can be produced by a digital VCO, and that a trapezoidal waveform has harmonics that are smaller than those of a square wave or a triangular wave. The known method uses a digital circuit which, in a succession of equal time intervals, first generates a point on a triangular waveform having a period equal to that of the sinusoidal waveform being approximated, and then generates a corresponding point on a trapezoidal waveform. A positively sloped portion of the triangular waveform is defined by repetitiously adding an incremental value until the ALU saturates at its maximum value. A negatively sloped portion of the triangular waveform is then defined by repetitiously subtracting the incremental value until the ALU saturates at its minimum value. The trapezoidal waveform is created by truncating the peaks of the triangular waveform.

The incremental value chosen must be small in order to minimize the phase error introduced by the amount of the incremental value in excess of the maximum amplitude at the saturation point of the ALU. Because the size of the incremental value is so limited, the range of frequencies that can be generated by this method is limited. This is because for high frequencies, a much higher sampling rate must be used to generate small incremental values relative to the period of the generated signal. The disadvantage of a large sampling rate is that a large number of calculations are required, thus reducing the availability of the ALU for other calculations. The present invention substantially mitigates or solves these problems.

SUMMARY OF THE INVENTION

The present invention is a method for producing a trapezoidal waveform approximating a sinusoidal waveform. The method provides for generating a triangular waveform and then truncating it to form a periodic waveform. The triangular waveform is generated by repetitiously adding an amplitude increment during a succession of equal time intervals to generate points on the positive slope of the triangular wave until a maximum value is reached. The time interval is determined by the desired sampling rate. The amplitude increment is proportional to the phase change of the desired sinusoidal frequency during the time interval. The maximum value is determined by a formula from the phase change and the amplitude increment. When the maximum value is exceeded, the slope of the triangular waveform is changed to negative and the next point is determined by subtracting the portion of the amplitude in excess of the maximum from the maximum value. Thereafter, the points on the negative slope are determined by repetitiously subtracting the amplitude increment until the minimum value is reached. At that time, the slope is changed to positive and the next point is determined by adding the portion of the amplitude increment beyond the minimum value to the minimum value. The triangular waveform produced is then truncated at a value equal to two-thirds of the maximum value to produce a trapezoidal waveform.

An analog signal can be produced from this digital representation of a trapezoidal waveform by interpolating to produce closely spaced points on the trapezoidal waveform and then processing the result through a digital-to-analog converter.

Another aspect of the present invention is that an accurate range of frequencies around a center frequency can be produced. The phase change of the center frequency during the sampling time interval is first determined. An additional phase change corresponding to the desired change in frequency is then added or subtracted. The new value is used to determine the amplitude increment, and the waveform is then generated according to the described method.

The invention can be implemented using general purpose digital circuitry including an ALU, a controller, and several memory registers. Since the circuitry can be general purpose, it has the advantage of being usable for other applications. The low sampling rate which is possible provides the additional advantage of reserving more time for such circuitry to be used for other applications.

The invention allows a continuous range of output frequencies to be generated since the error due to ALU saturation in the prior method is avoided by determining the next point on the next slope of the triangular waveform when the maximum or minimum value is exceeded.

Another benefit is that an accurate range of frequencies around any center frequency can be generated because a low sampling rate is used which is not dependent on the center frequency.

DESCRIPTION OF A PREFERRED EMBODIMENT

The preferred embodiments of the present invention include a method for approximating sinusoidal waveforms with trapezoidal waveforms and a general purpose arithmetic processor adapted for generating digital signals according to the method. First, the method for approximating sinusoidal waveforms with trapezoidal waveforms will be described with reference to FIGS. 1 and 4. Next, the general implementation of the invention will be described with reference to the flow chart of FIG. 2. Finally, a specific implementation with a general purpose arithmetic processor will be described with reference to FIGS. 3 and 4.

Figure 1:
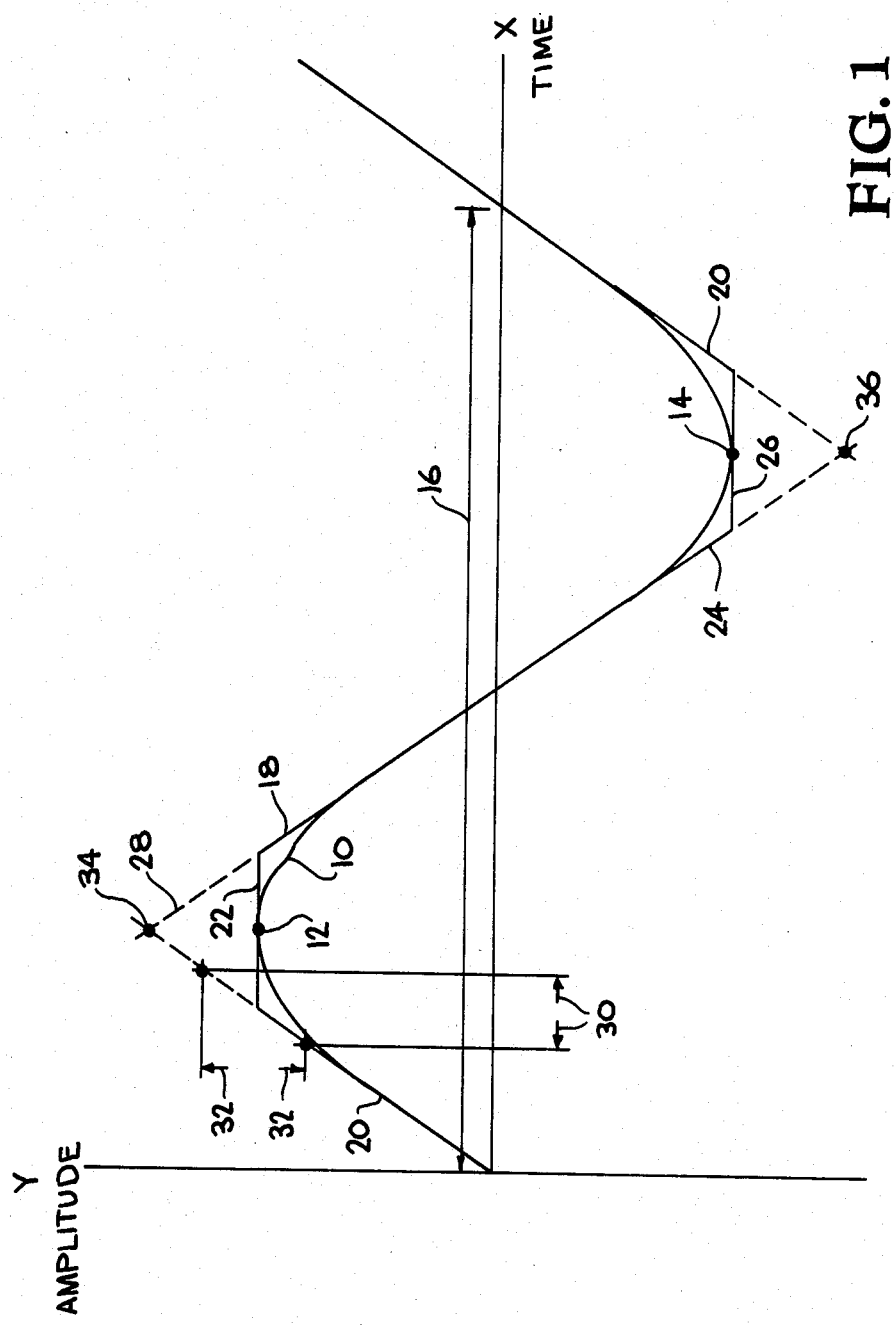
FIG. 1 is a graphical representation of the method for forming a trapezoidal waveform.

In FIG. 1, a signal having a sinusoidal waveform 10 is shown. Sinusoid 10 has a time varying signal strength that varies sinusoidally with time between positive and negative peak values represented by points 12 and 14. Each complete oscillation of the sinusoid defines one period represented by bidirectional arrow 16.

A signal composed of a periodic trapezoidal waveform 18 can be utilized to approximate sinusoidal waveform 10. Trapezoidal waveform 18 has a positively sloped portion 20 that extends from negative peak value 14 up to positive peak value 12, followed by a first constant value portion 22 equal to the positive peak value, followed by a negatively sloped portion 24 that extends from the positive peak value down to the negative peak value, and followed by a second constant value portion 26 equal to the negative peak value. Since the trapezoidal waveform is periodic, the second constant value portion 26 is followed by another positively sloped portion 20, which is in turn followed by another first constant value portion 22, etc. Although FIG. 1 illustrates the positively sloped portion 20 as two discontinuous segments, it does extend continuously from negative peak 14 to positive peak 12. FIG. 1 shows only one of several periods of the trapezoidal and sinusoidal waveforms.

Periodic trapezoidal waveform 18 has certain characteristics that make it a fairly good approximation of sinusoid 10. One characteristic is that the period of the trapezoidal waveform is substantially equal to the period 16 of the sinusoidal waveform 10. Another characteristic is that the maximum and minimum values of the trapezoidal waveform are substantially equal to the positive and negative peak values of the sinusoid. A further characteristic is that the magnitude of the slopes of sloped portions 20 and 24 are equal. A still further characteristic is that the time duration of each sloped portion 20 and 24 is substantially equal to one third of period 16, and the time duration of each constant value portion 22 and 26 is substantially equal to one-sixth of period 16.

The reason why trapezoidal waveform 18 is such a close approximation to sinusoidal waveform 10 may be shown by expressing the trapezoidal waveform in terms of a Fourier series. In general, a waveform which is a bounded periodic function can be created by adding together a number of sinusoidal waveforms. Each point on the waveform can thus be represented by a series summation of cosine and sine terms called a Fourier series. Since trapezoidal waveform 18 is a bounded periodic function, a Fourier series representation can be formed. The Fourier series representation of trapezoidal waveform 18, F(t), is expressed as follows:

$$F(t) = (4*A*B)/(pi^2*R)*[sin(pi*R/B)*sin(pi*t/B) +$$

$$(1/3^2)*sin(3*pi*R/B)*sin(3*pi*t/B) +$$

$$(1/5^2)*sin(5*pi*R/B)*sin(5*pi*t/B) +$$

-continued
$$(1/7^2)*sin(7*pi*R/B)*sin(7*pi*t/B) +$$

$$(1/9^2)*sin(9*pi*R/B)*sin(9*pi*t/B) +$$

$$(1/11^2)*sin(11*pi*R/B)*sin(11*pi*t/B) +$$

$$\ldots ]$$

where A is amplitude and equals one-half of the range from positive peak 12 to negative peak 14, B equals one-half of period 16, R equals one-half of the duration of the sloped portion 20 or 24, t equals the variable time and pi=3.14159.

The Fourier series representation of trapezoidal waveform 18 includes a fundamental sine term, sin(pi*t/B), having a period equal to 2B, which corresponds to sinusoidal waveform 10. The Fourier series also includes sine terms of periods 2B/3, 2B/5, 2B/7, 2B/9, 2B/11, etc., which correspond to higher frequency harmonics of sinusoid 10. If all of the higher frequency harmonic terms of F(t) were equal to zero, then trapezoidal waveform 18 would be an exact representation of sinusoid 10. Thus, the best representation is achieved when the higher frequency harmonic terms are minimized. Since the coefficients of the harmonic terms decrease as their frequencies increase, the contribution of the higher frequency harmonic terms is less than the contribution of the lower frequency harmonic terms. The largest contributor is the sin(3*pi*t/B) term, which has a period of 2B/3 and a frequency of three times that of sinusoid 10. The coefficient of this term is $(1/3^2)*sin (3*pi*R/B)$. By selecting R to be equal to one-third of B, the coefficient of the sin(3*pi*t/B) term is equal to zero. The Fourier series representation then reduces to:

$$F(x) = A*[1.05296*sin(x) + 0.00000*sin(3x) -$$

$$0.04212*sin(5x) + 0.02148*sin(7x) +$$

$$0.00000*sin(9x) - 0.00871*sin(11x) +$$

$$\ldots ]$$

where x=pi*t/B. Note that the 3x and 9x terms drop out, and that the 5x, 7x and 11x terms are small in comparison to the fundamental term, sin(x).

Thus, by selecting R to be equal to one-third or B, trapezoidal waveform 18 best represents sinusoid 10. This corresponds to the characteristic described above wherein the duration of each sloped portion is equal to one-third of period 16, and the duration of each constant value portion is equal to one-sixth of period 16.

FIG. 1 also graphically illustrates a method for forming a signal having a trapezoidal waveform. A triangular waveform 28 is generated, which will later be truncated to form the trapezoidal waveform.

First, a desired sampling frequency is chosen. The time interval represented by opposing arrows 30 is equal to the period of the sampling frequency. Next, the change in amplitude of the desired waveform 28 during time interval 30 must be determined, and is represented by an amplitude increment represented by opposing arrows 32.

For a triangular waveform, there is a linear relationship between the amplitude (y axis) and the phase (x axis). Thus, amplitude increment 32 can be expressed as the phase change, $K_p$, of the desired output frequency (waveform 28) during time interval 30 multiplied by a constant. Thus, $$\text{amp. inc.} = K_p * \text{Constant} \quad \text{Eq. (1)}$$

where amp. inc. is the amplitude increment.

The constant can be determined as follows. If time interval 30 were equal to period 16, the amplitude increment would have to cover the entire change in amplitude of the triangular waveform during period 16, which is the maximum value of the triangular waveform, represented by point 34, multiplied by 4. For other values of time interval 30, it can be seen that the amplitude increment is the maximum value multiplied by 4 and then multiplied by a value equal to time interval 30 divided by period 16. Because time interval 30 is the period of the sampling frequency, $f_s$, period 16 is the period of the desired output frequency, $f_{out}$, and any waveform period is the inverse of the frequency, the amplitude increment can also be expressed as:

$$\text{amp. inc.} = 4 * \text{maximum value} * f_{out}/f_s \quad \text{Eq. (2)}$$

The phase constant $K_p$ can be expressed as follows. Because $K_p$ is the phase change of $f_{out}$ during time interval 30, if time interval 30 (the period of $f_s$) is equal to period 16 (the period of $f_{out}$), $K_p$ (in radians) would be $2*pi$. It can be seen that, for other values of time interval 30, $K_p$ can be expressed in radians as follows:

$$K_p = 2*pi*f_{out}/f_s \quad \text{Eq. (3)}$$

By combining equations 2 and 3, the amplitude increment can be determined as follows:

$$\text{amp. inc.} = K_p * 2 * \text{maximum}/pi \quad \text{Eq. (4)}$$

The peak value is chosen to give the desired amplitude for the output frequency.

An understanding of the generation of waveform 28 in FIG. 1 is aided by reference to the flow chart of FIG. 4, which shows the operation of the circuit of FIG. 3, discussed later, where the accumulator stores the amplitude value. To generate waveform 28, amplitude increment 32 is added to the amplitude value during each time interval 30. When the amplitude value generated is greater than the maximum value, the next point is on the negatively sloped portion of waveform 28. The portion of the amplitude increment in excess of the maximum must be subtracted from the maximum to give this next point. This subtraction result can also be achieved by subtracting the new amplitude value which is in excess of the maximum from twice the maximum.

To produce the negatively sloped portion of waveform 28, the amplitude increment is subtracted during each time interval until the minimum value represented by point 36 is reached or exceeded. The next point should be on the positively sloped portion of waveform 28, and is determined by subtracting the new amplitude value from twice the minimum value.

A numerical example may be helpful. Assume that the maximum value is 1.0, the minimum value is $-1.0$, the current amplitude value is 0.1, the amplitude increment is 0.6, and the slope of the waveform is negative. The next amplitude is generated by adding $-0.6$ to 0.1 to give $-0.5$. The value of $-0.5$ is compared to the minimum value, and since it does not exceed the minimum value, it becomes the output amplitude. In addition, the slope is still negative, so the amplitude increment is still negative. The next amplitude is generated by adding $-0.6$ to $-0.5$ to give $-1.1$. This is compared to the minimum value of $-1.0$ and round to exceed it, so the output amplitude is calculated as 2*(minimum value $= -1.0) - (-1.1) = -0.9$. Thus, the output amplitude is $-0.9$ and the amplitude increment is changed from $-0.6$ to 0.6. The positive slope of the triangular waveform is then generated in the succeeding time intervals until the maximum value is exceeded, after which the sign of the amplitude increment is again changed to negative and the process is repeated.

After the triangular waveform is generated, it is truncated to give trapezoidal waveform 18. As discussed before, each flat portion 22 and 26 of the trapezoidal waveform is 1/6 of period 16, while the positively sloped portion 20 and the negatively sloped portion 24 are each 1/3 of period 16. The positive portion of the positive slope thus has a duration of 1/6 of the period and would reach the maximum value in half of the time covered by the flat portion 22, or 1/12 of the period. Because the amplitude and phase are proportional, the amplitude of the flat portion 22 is the maximum value multiplied by 1/6 period and divided by 1/6 period plus 1/12 period, thus giving the amplitude of the flat portion as 2/3 the maximum value as follows:

$$(\text{maximum}*1/6 \text{ period})/(1/6 + 1/12 \text{ period}) = \tfrac{2}{3}\text{maximum}$$

Figure 2:
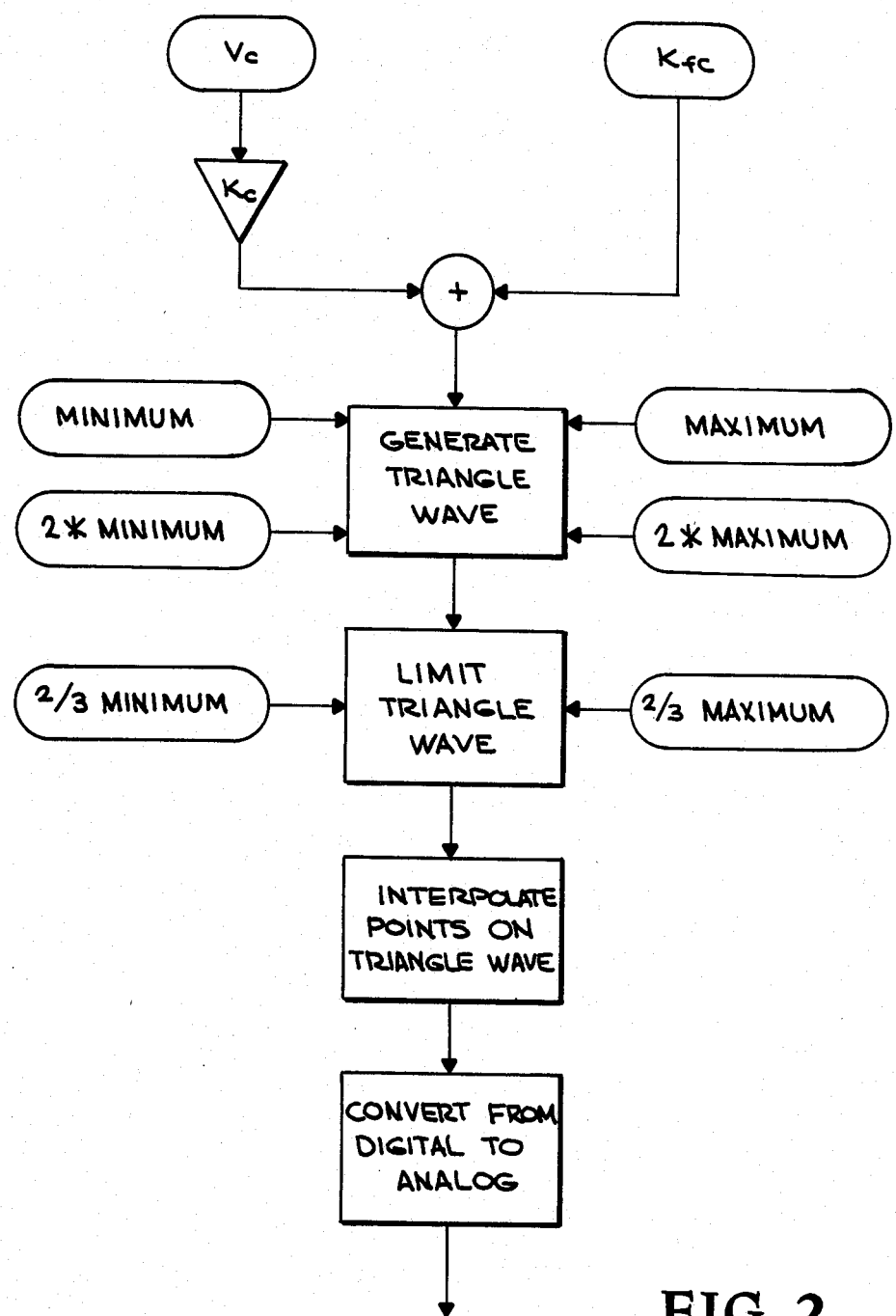
FIG. 2 is a flow chart of the operation of the invention.

FIG. 2 is a flow chart of the operation of the invention. In addition, FIG. 2 illustrates an additional feature of the invention allowing the generation of an output frequency which varies by a small amount from a given center frequency. This is accomplished by altering the amplitude increment used to generate the triangular waveform. Referring to FIG. 2, the phase change $K_{fc}$, of the center frequency during one period of the sampling frequency is first determined. An incremental phase change, which may be positive or negative, is added to $K_{fc}$ to give the phase change $K_p$ of the desired output frequency. This phase increment can be represented by a voltage $V_c$ which is multiplied by a scaling factor $K_c$. Adding this phase increment to $K_{fc}$ gives a new phase constant $K_p$ which is used to determine the amplitude increment used to generate the triangle wave. Thus, $K_p$ is determined as follows:

$$K_p = K_{fc} + K_c * V_c \quad \text{Eq. (4)}$$

Combining equations 3 and 4 yields equation 5:

$$f_{out} = (K_{fc} + K_c * V_c) * f_s/(2*pi) \quad \text{Eq. (5)}$$

where $K_{fc}$ and $K_c$ are expressed in radians.

Equation 5 shows that any frequency for an output can be generated by choosing the appropriate values for $K_{fc}$, $V_c$ and $K_c$.

After the triangle wave is generated, it is limited to $\tfrac{2}{3}$ of its maximum and minimum values. By interpolation, a large number of points on the waveform are created, and the signal is then converted from digital to an analog signal. The limiting and interpolating functions are easily performed by a microprocessor or a similar device by known methods.

Figure 3:
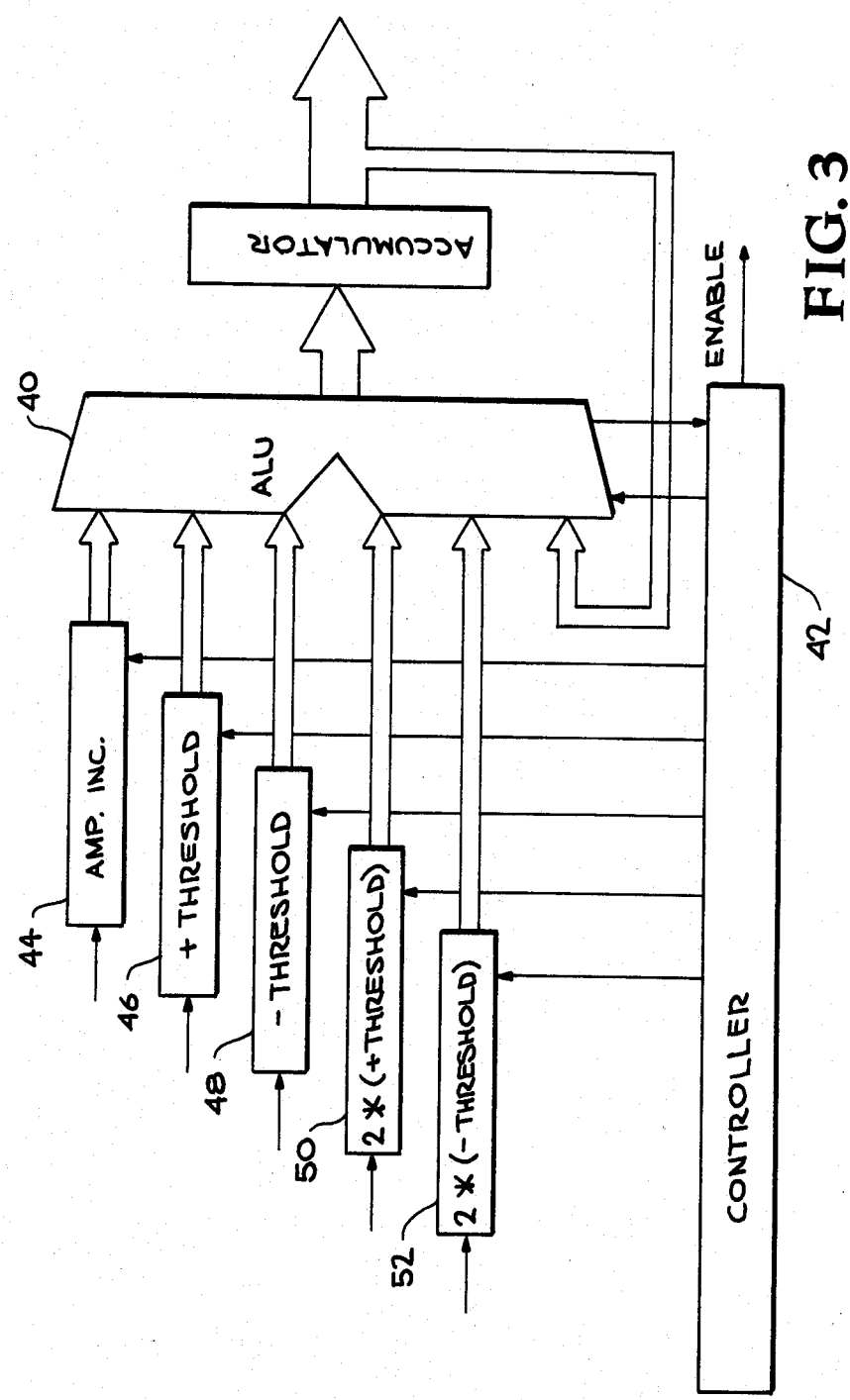
FIG. 3 is a block diagram of a circuit for forming the triangular waveform used to generate the trapezoidal waveform.

FIG. 3 illustrates a digital circuit for performing the method of generating a triangular wave of the present invention. The circuit includes an arithmetic logic unit (ALU) and accumulator 40, a controller 42 and several registers 44, 46, 48, 50, and 52. The ALU is capable of addition, subtraction and comparison. The accumulator is a storage register that holds the results of the latest arithmetic operation performed by the ALU, and can also serve as an input register to the ALU. Controller 42 monitors the ALU to detect a comparison showing an amplitude value in excess of the maximum value or less than the minimum value, and generally controls the operation of the circuit. The accumulator holds the current amplitude value, register 44 holds the amplitude increment, and registers 46, 48, 50, and 52 hold the maximum value, minimum value, twice the maximum value, and twice the minimum value, respectively. The output terminals of the registers are connected to input terminals of the ALU. An output terminal of the ALU issues the output signal.

Figure 4:
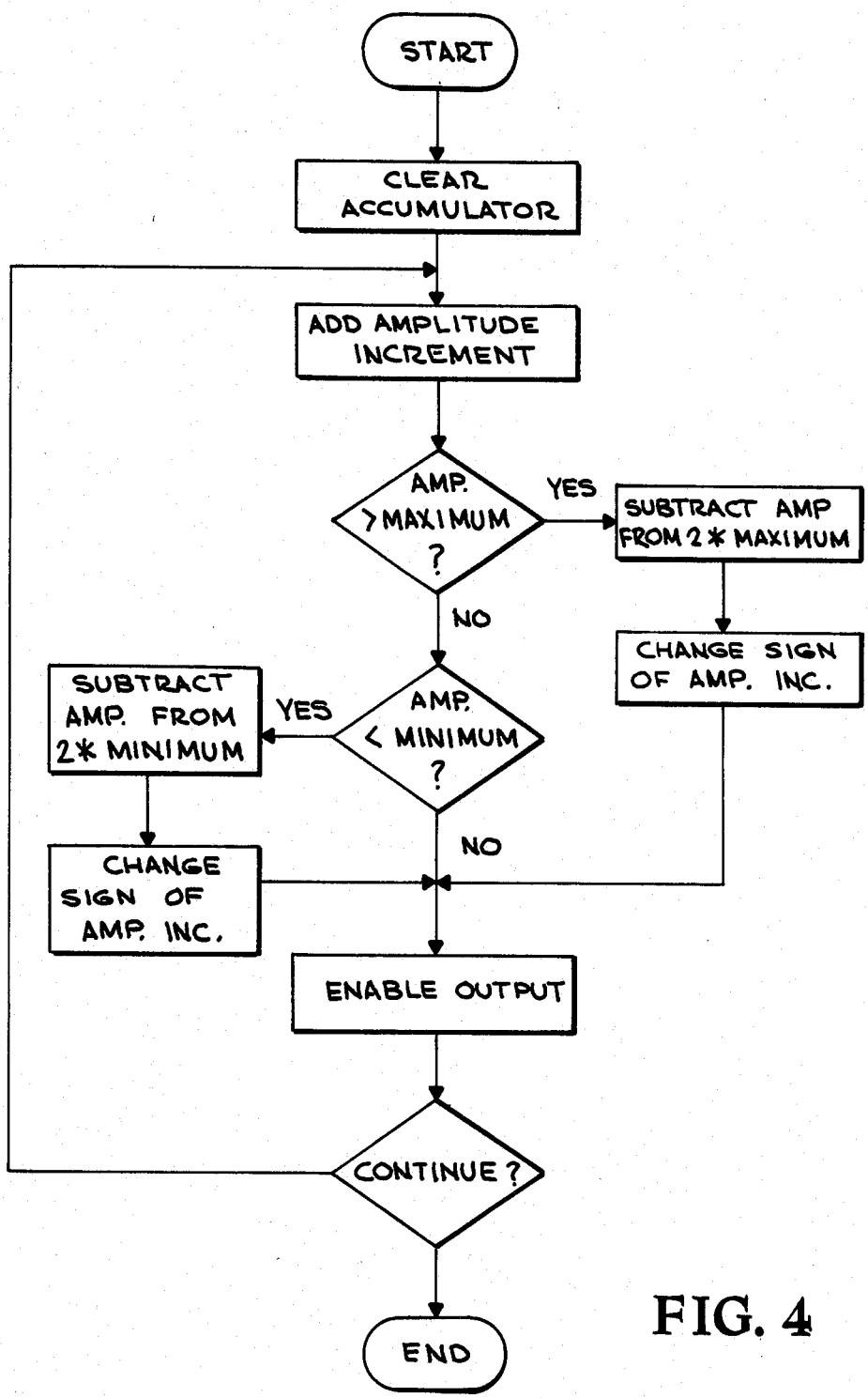
FIG. 4 is a flow chart of the operation of the triangle wave generator circuit of FIG. 2.

To generate a triangular waveform, the circuit operates according to the flowchart of FIG. 4. First, the accumulator is cleared. Then, the input amplitude increment is added to the value of the accumulator and the result is stored in the accumulator. Next, the ALU compares the value in the accumulator with the maximum and minimum values. If neither value is exceeded, the accumulator value is the current value of the triangular waveform and controller 42 sends an enable signal to the next stage (not shown).

If the comparison shows that either the maximum or minimum value is exceeded, the controller instructs the ALU to subtract the accumulator value from twice the exceeded value. The resulting value becomes the accumulator value and is the current value of the triangular waveform. Controller 42 then sends an enable signal to the next stage and changes the sign of the amplitude increment in register 44. The process is repeated to produce subsequent points on the digital waveform.

The triangular wave output is then limited to form a trapezoidal wave and may have additional points added by interpolation and be processed through a digital to analog converter to produce the output oscillating signal. The limiting, interpolating and digital to analog conversion methods are well known to those skilled in the art.

From the above description, it will be apparent that the invention disclosed herein provides a novel and advantageous method for approximating sinusoidal waveforms with trapezoidal waveforms. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for generating an output time varying signal that approximates a signal having a sinusoidal waveform, comprising the steps of:
   selecting a time interval equal to a fraction of the period of the sinusoidal waveform;
   selecting a maximum value and a minimum value of equal magnitude which are one and one-half times the desired maximum value and a minimum value of the output signal;
   determining a phase increment equal to the change in phase of the sinusoidal waveform during the time interval;
   determining an amplitude increment equal to the phase increment multiplied by twice the maximum value and divided by pi;
   forming the positively sloped portion of a triangular waveform by repetitiously adding the amplitude increment to create an amplitude value at each time interval until the maximum value is reached;
   changing the slope of the triangular waveform in the interval in which the maximum value is exceeded by subtracting the portion of the amplitude increment in excess of the maximum value from the maximum value to create the next amplitude value;
   forming the negatively sloped portion of the triangular waveform by repetitiously subtracting the amplitude increment to create each amplitude value until the minimum value is reached;
   changing the slope of the triangular waveform in the time interval in which the minimum value is exceeded by adding the portion of the amplitude increment beyond the minimum value to the minimum value to create the next amplitude value; and
   truncating the resulting triangular waveform to form a trapezoidal waveform.

2. A method as recited in claim 1 wherein the step of truncating the triangular waveform comprises the steps of:
   making each amplitude value in excess of two-thirds of the maximum value equal to two-thirds of the maximum value; and
   making each amplitude value less than two-thirds of the minimum value equal to two-thirds of the minimum value.

3. A method for utilizing an input signal to generate an output signal that approximates a sinusoidal waveform with a frequency which varies by a specified amount from the frequency of the input signal comprising the steps of:
   selecting a time interval equal to a fraction of the period of the input signal;
   selecting a maximum value and a minimum value of equal which are one and one-half times the desired maximum and minimum amplitudes of the output signal;
   determining a phase increment equal to the change in phase of the input signal during the time interval plus a value equal to the additional phase change of the desired output signal during the time interval;
   determining an amplitude increment equal to the phase increment multiplied by twice the maximum value andd divided by pi;
   forming the positively sloped portion of a triangular waveform by repetitiously adding the amplitude increment to create a new amplitude value at each time interval until the maximum value is reached;
   changing the slope of the triangular waveform in the time interval in which the maximum value is exceeded by subtracting the portion of the amplitude increment in excess of the maximum value from the maximum value to create the next amplitude value;
   forming the negatively sloped portion of the triangular waveform by repetitiously subtracting the amplitude increment to create each amplitude value until the minimum value is reached;
   changing the slope of the triangular waveform in the time interval in which the minimum value is exceeded by adding the portion of the amplitude increment beyond the minimum value to the minimum value to create the next amplitude value; and truncating the resulting triangular waveform to form a trapezoidal waveform.

4. A method as recited in claim 3 wherein the step of truncating the triangular waveform comprises the steps of:
  making each amplitude value in excess of two-thirds of the maximum value equal to two-thirds of the maximum value; and
  making each amplitude value less than two-thirds of the minimum value equal to two-thirds of the minumum value.

* * * * *